United States Patent [19]

Foust et al.

[11] Patent Number: 4,873,136

[45] Date of Patent: Oct. 10, 1989

[54] METHOD FOR PREPARING POLYMER SURFACES FOR SUBSEQUENT PLATING THEREON, AND IMPROVED METAL-PLATED PLASTIC ARTICLES MADE THEREFROM

[75] Inventors: Donald F. Foust; Edward J. Lamby, both of Scotia; Bradley R. Karas, Amsterdam; William V. Dumas, Delanson; Elihu C. Jerabek, Glenmont, all of N.Y.

[73] Assignee: General Electric Company, Schenectady, N.Y.

[21] Appl. No.: 207,462

[22] Filed: Jun. 16, 1988

[51] Int. Cl.$^4$ .................... B32B 3/00; B32B 7/00; B44C 1/22; H05K 1/00

[52] U.S. Cl. .................... 428/209; 156/656; 156/659.1; 156/668; 156/902; 204/30; 427/96; 427/98; 427/304; 427/307; 428/458; 428/474.4; 428/601; 428/626; 428/901

[58] Field of Search .............. 204/30, 32.1, 38.4, 204/40, 44; 427/96, 98, 304, 305, 306, 307; 428/601, 626, 209, 458, 474.4, 901; 174/68.5; 29/846; 156/656, 659.1, 668, 902

[56] References Cited

U.S. PATENT DOCUMENTS

| | | | |
|---|---|---|---|
| 4,517,254 | 5/1985 | Grapentin et al. | 428/626 |
| 4,528,245 | 7/1985 | Jobbins | 204/38.4 X |
| 4,775,449 | 10/1988 | Dumas et al. | 204/30 |
| 4,790,912 | 12/1988 | Holtzman et al. | 204/38.4 X |

FOREIGN PATENT DOCUMENTS 3328765 2/1985 Denmark.
2123036 6/1983 United Kingdom.

OTHER PUBLICATIONS

*IBM Technical Disclosure Bulletin*, Sep. 1986, vol. 29, No. 4, p. 1708.

*Chemical and Engineering News*, "Functional Groups Put On Polymer Surfaces", Sep. 22, 1986, pp. 27–28.
*Chemical Abstracts*, Ger. Offen. DE 3,612,822, Mahlkow, 108: 132996n, "Metallization of Polyether-Polyimides with Good Adhesion".
*The Iron Age*, Jul. 27, 1950, "Plating Range Tests Improve Plating Baths", Mohler, pp. 63–64.
*Printed Circuit Fabrication*, Jacobi, "Molded Wiring Board Materials and Processes", vol. 9, No. 7, Jul. 1986, pp. 50–61.
*Zhur. Prik. Khim.*, Engl. Ed. 59, Vorob'eva et al. (1986), pp. 508–513.
*Printed Circuit Fabrication*, Carano, "Acid Copper Plating of High Aspect Ratio MLBs", vol. 9, No. 12, Dec. 1986, pp. 34–47.

*Primary Examiner*—William A. Powell
*Attorney, Agent, or Firm*—William H. Pittman; James C. Davis, Jr.

[57] ABSTRACT

An improved method for pretreating a polyimide surface in preparation for an adhesion promotion treatment and subsequent metallization is disclosed, wherein the pretreatment comprises mild etching of the surface, contact of the surface with a basic solution, and contact of the surface with a cationic surfactant which is capable of removing a residual film formed on the surface after the mild etching step. This invention further includes articles such as printed circuit boards, which comprise a polyimide substrate pretreated as described above and then treated with an adhesion promoter, wherein an electrolessly-applied metal layer is disposed on the substrate, and an electrolytically-applied metal layer free of chemical additives is disposed on the electrolessly-applied layer. The article may include an additional electrolytically-applied layer containing chemical additives and disposed on top of the first electrolytic layer.

32 Claims, No Drawings

METHOD FOR PREPARING POLYMER SURFACES FOR SUBSEQUENT PLATING THEREON, AND IMPROVED METAL-PLATED PLASTIC ARTICLES MADE THEREFROM

BACKGROUND OF THE INVENTION

This invention relates to improved methods for plating metal onto a polyimide surface, and to further improvements in the quality of metal-plated polyimide substrates.

Printed circuit boards have become the dominant vehicle for mounting and interconnecting electronic components in order to manufacture a desired electronic circuit. The printed circuit board usually consists of a sheet of a dielectric substrate constructed from various filled or unfilled synthetic materials. The substrate is provided with a pattern of thin metal foil which functions as a conductive path on one or both sides. The paths or "traces" are usually formed of a conductive material such as copper, palladium, nickel or gold. The traces collectively define all of the electrical connections between components on the board, and are routed between appropriate locations.

Thermoplastic materials such as polyimides are particularly suitable for printed circuit board substrates because of their strength, heat resistance, dimensional stability, and easy moldability. However, polyimide substrates are not easily provided with a strongly adherent metal trace. The printed circuit, i.e., the plated metal conductive path, can be damaged or separated from the substrate during subsequent manufacturing steps or during use of the circuit board.

Several attempts have been made to increase the adhesion of the conductive metal traces to polyimide substrates. Adhesion is generally measured as "peel strength", i.e., the force under controlled conditions required to peel the trace from the substrate. One of the prior art methods for improving adhesion involves grit-blasting the surface to provide a roughened profile which anchors the subsequently-applied metals. Other methods call for the use of chemical swelling agents or penetrants to swell the surface.

Dissatisfaction with the above-described adhesion promotion techniques led to several new discoveries in this area of technology. As described in application Ser. No. 947,116 of Dumas et al., filed Dec. 29, 1986, now U.S. Pat. No. 4,775,449, adhesion of a metallization layer to a polyimide surface can be improved by treatment of the surface with an adhesion-promoting compound characterized by the presence of an >NO— moiety, such as hydroxylamine. Furthermore, Foust et al. teach an adhesion-promotion method utilizing organic double bond-containing compounds such as thiourea in application Ser. No. 103,618, filed Sept. 28, 1987. Both of these methods are frequently enhanced by an initial surface pretreatment which involves contact of the surface with a mild etching compound, followed by contact with a basic solution which often includes short chain alcohols, and then contact with a solution of an alcohol and another mild etching compound. This pretreatment results in a clean, water-wettable surface which is particularly suitable for the subsequent adhesion-promoting treatment.

There is a growing interest at commercial plating facilities in plating processes which do not require the use of flammable solvents such as methanol and ethanol. As in other chemical industries, attention has centered on the use of aqueous-based systems because, in addition to being nonflammable, water is nontoxic and easy to handle.

However, aqueous solutions generally do not have the solubilizing capability of most organic solvents. For example, in the pretreatment processes described above, a surface residue of plastic formed during the initial etching step is very effectively removed from the surface during the subsequent steps which use methanol or other alcohols. In contrast, water is not effective for removing this residue, thereby leaving a substrate which is not particularly amenable to the subsequent adhesion promotion and plating processes.

It is therefore a primary objective of the present invention to provide an effective aqueous-based pretreatment process for polyimide surfaces which are to be subsequently treated with an adhesion promoter and then plated with a metal.

An additional objective of this invention is to provide a method for applying highly adherent metal layers onto polyimide substrates while eliminating or greatly reducing the use of volatile solvents.

Yet another objective of the present invention is to provide a metal-plated polyimide substrate, e.g., in the form of a printed circuit board, wherein the circuit metal is characterized by a smooth finish, bright appearance, and a high level of adhesion to the polyimide surface.

SUMMARY OF THE INVENTION

The objectives mentioned above are accomplished by an improved method for pretreating a polyimide surface in preparation for an adhesion promotion treatment and subsequent metallization on the surface, wherein the pretreatment comprises:

(A) mild etching of the surface;

(B) contact of the surface with a basic solution; and (C) contact of the surface with a cationic surfactant which is capable of removing a residual film formed on the surface after step (A).

This invention further includes articles which comprise a polyimide substrate pretreated as described above and then treated with an adhesion promoter, wherein an electrolessly-applied metal layer is disposed on the substrate, and an electrolytically-applied metal layer substantially free of chemical additives is disposed on the electroless layer. The article may include an additional electrolytically-applied layer containing chemical additives and disposed on top of the first electrolytic layer.

DETAILED DESCRIPTION OF THE INVENTION

The choice of a particular polyimide material for treatment according to the present invention is not critical. Polyimides are well-known in the art, and are described, for example, in the *Kirk-Othmer Encyclopedia of Chemical Technology*, Third Edition, Volume 18. Especially preferred polyimides for the present invention are those commonly referred to as "polyetherimides"—for example, those formed by the reaction of bisphenol A dianhydride (BPADA) with phenylene diamine. Examples of polyetherimides and methods for their preparation are described in U.S. Pat. Nos. 3,983,093 and 4,360,633, issued to Williams, III et al. and Bolon et al., respectively. Both of these patents are incorporated herein by reference.

The polyimides may contain various amounts of fillers or reinforcing agents, all of which are well-known in the art. Illustrative fillers and reinforcing agents are disclosed in U.S. Pat. No. 4,525,508, incorporated herein by reference. These materials include talcs, mica, aluminum silicates (clay), zinc oxide, calcium metaphosphate, titanium dioxide, carbon black, franklinite, precipitated or natural calcium carbonate, glass fibers, glass spheres, silicone-polyimide copolymeric materials, carbon fibers, and the like, as well as mixtures thereof.

These polyimides may of course contain various other additives, such as pigments, ultraviolet radiation absorbing agents, impact modifiers, plasticizers, antioxidants, stabilizers, processing aids, antistatic agents, and the like.

The substrate of the present invention may be in a variety of shapes and sizes. For example, the substrate may be a printed circuit board having flat or curved surfaces, which can also include various cavities, raised regions, and through-holes; and can comprise two or more discrete polyimide layers, e.g., a multi-level circuit board.

The polyimide surface to be pretreated according to this invention should be reasonably clean before any further steps are taken. Various cleaning agents may be used, with the proviso that they not in any way degrade the polyimide surface. Suitable cleaners include halocarbon materials, e.g., Freon ® solvents such as 1,1,2-trichloro-1,2,2-trifluoroethane.

In step (A), the clean polyimide surface is mildly etched to form a residual film thereon. Examples of mild etching compounds suitable for use on the polyimide surface include sulfuric acid, N,N-dimethylformamide, N-methyl-2-pyrrolidone, pyridine, tetrahydrofuran, and methylene chloride. Although these compounds remove a layer of the polyimide surface as described below, they are considered mildly etching and non-aggressive because, when used according to the procedures described herein, they do not swell or crack the bulk of the polyimide substrate, as often occurs when swell and etch techniques of the prior art are employed. The term "bulk" of the substrate as used herein is the region of the substrate which is about 15 microns or greater below the surface being plated by the various embodiments of this invention.

Sulfuric acid is the preferred mild etching compound because of its low cost and miscibility with water, and is preferably used in highly concentrated form, i.e., at least about 85% by weight in water.

The mild etching compound may be applied by well-known methods, e.g., brushing, spraying, or immersion of the substrate, and in preferred embodiments, is followed by one or more rinsing steps with water, methanol or other alcohols. Water is the preferred rinsing agent because one of the objectives of this invention is to minimize or eliminate the use of flammable solvents.

The preferred technique of contacting the substrate with any of the rinsing, pretreatment and adhesion-promotion treatment compositions of this invention involves immersion of the substrate in a bath which contains the particular composition. While this description thus emphasizes the immersion technique, it should be understood that those of ordinary skill in the art can apply these teachings to other known contact techniques, such as those mentioned above, without undue experimentation.

Treatment with the mild etching compound may be carried out for about 15 seconds to about 5 minutes, and is usually followed by a water rinse. The most effective treatment duration depends in part on the particular application method. When the substrate is to be immersed in a solution of the mild etching compound, treatment is usually carried out for no more than about 3 minutes, although this time period is dependent on the concentration of the mild etching compound and the temperature of the solution. Generally, a room-temperature bath is sufficient, although increasing the bath temperature can shorten the treatment time. Similarly, increasing the concentration of etching compound (e.g., sulfuric acid) can shorten the treatment time. Those skilled in the art will be able to readily determine an appropriate time/temperature/concentration regimen for a particular treatment system.

A residual film of varying thickness is formed on the polyimide surface during treatment with the mild etching compound. The film remains on the surface even after rinsing. In step (B), the film is treated with a basic (i.e., alkaline) solution by one of the techniques described above for about 30 seconds to about 10 minutes. This step appears to modify the residual film, making it less adherent to the polyimide surface. Suitable basic solutions include those formed by dissolving 0.1 molar(M) to about 10M of a basic compound such as sodium hydroxide, potassium hydroxide, tetramethylammonium hydroxide, and mixtures thereof in a solvent such as water. In some embodiments, other solvents might be used, such as methanol, ethanol, ethylene glycol, and mixtures thereof. However, water is the preferred solvent because of its nonflammability. In general, those skilled in the art will be able to select a particular solvent, solute, and solute concentration without undue experimentation. As in step (A), a room-temperature solution is sufficient. A water rinse of the surface usually follows step (B).

In step (C), the film residue is removed by contact of the surface with a cationic surfactant. The central atom of this type of compound is usually a nitrogen or phosphorus cation, and often bonds to one or more organic side chains, e.g., quaternary ammonium salts, or is part of an organic heterocyclic system such as pyridine.

There are two requirements for the cationic surfactant used in this step of the present invention. First, it must be capable of removing the film residue from the polyimide surface. Second, if the surfactant is a solid, it must be soluble in the carrier solution, which is usually water.

Furthermore, the maximum carbon chain length of alkyl groups attached to the cation is influenced by the solubility of the cationic surfactant in the carrier solution. For example, alkylpyridinium halides which contain carbon chains of 20 or more atoms usually have limited water solubility, i.e., less than about 1% or 2% by weight. Such compounds could be used if concentrations less than about 1% by weight prove to be effective in removing the residual film. An indication that a particular surfactant is probably not soluble enough for use in step (C) is the appearance of an oily surface on the polyimide after contact with the surfactant composition.

Members of the chemical compound families listed below are examples of suitable cationic surfactants for step (C) of this invention:

(1) Alkylpyridinium Halides

Illustrative alkylpyridinium halides of this type include cetylpyridinium chloride and dodecylpyridinium chloride.

(2) Alkyltrimethylammonium Halides

Examples of suitable compounds of this type include octyltrimethylammonium bromide, decyltrimethylammonium bromide, dodecyltrimethylammonium bromide, and hexadecyltrimethylammonium bromide.

(3) Alkyltriphenylphosphonium Halides

Examples of suitable compounds of this type include decyltriphenylphosphonium bromide and dodecyltriphenylphosphonium bromide. Compounds of this type having an alkyl chain which contains less than about 8 carbon atoms do not appear to be effective in cleaning the surface, as shown in the examples which follow. Furthermore, compounds of this type containing about 15 or more carbon atoms in the main alkyl chain have marginal solubility in water, and are therefore also usually not suitable.

(4) Tetraalkylammonium Halides

An exemplary compound of this type for the present invention is tetrabutylammonium chloride. Compounds of this type containing less than about 4 carbon atoms in an alkyl chain do not remove the residual film, while those compounds containing about 6 or more carbon atoms in the main chain have limited solubility in water, and are also usually not suitable for the present invention. Furthermore, these compounds should be used in water at a concentration of at least about 1%, and at a treatment temperature of at least about 50° C.

Another cationic surfactant which may be used in this process is stearyldimethylbenzylammonium bromide.

Hydrates of many of the above compounds may also be used, such as cetylpyridinium chloride monohydrate. The preferred cationic surfactants for step (C) are cetylpyridinium chloride monohydrate, cetylpyridinium bromide monohydrate, dodecyltrimethylammonium bromide, and hexadecyltrimethylammonium bromide. In terms of cost, availability and effectiveness, cetylpyridinium chloride monohydrate is most preferred.

Cationic surfactants which are solids are usually used in the form of an aqueous solution. Liquid cationic surfactants may be used directly without dilution by a solvent, but are also usually used in the form of an aqueous solution for the sake of convenience.

The concentration of the long-chain cationic surfactant in solution ranges from about $3 \times 10^{-4}$M to about 0.3M, with the preferred range being from about 0.01M to about 0.1M. A particular concentration within these ranges can be determined by those of ordinary skill in the art without undue experimentation by considering various factors, such as surfactant solubility, the amount of residue present on the polyimide surface, and the effectiveness of the particular surfactant.

The time period of contact between the cationic surfactant and the polyimide surface is in part dictated by the concentration of the surfactant in solution, and usually ranges from about 2 minutes to about 10 minutes when the substrate is immersed in a solution of the surfactant. A preferred immersion time ranges from about 5 minutes to about 10 minutes.

Although the surfactant solution is effective when used at room temperature, temperatures in the range of about 40° C. to 60° C. are often preferred, especially when solubility of a particular surfactant in water is somewhat limited. Furthermore, higher temperatures within this range appear to hasten removal of the residual film.

The aqueous solution containing the cationic surfactant is often mildly aerated to aid in removal of the residual film. This may be accomplished by simply bubbling air through the solution. Since foaming of the surfactant may occur during aeration, an anti-foaming agent may also be added to the solution in effective amounts, e.g., usually from about 100 parts per million (ppm) to about 2500 ppm, based on the entire weight of the solution. A wide variety of anti-foamers may be used, with the proviso that they neither adversely affect the polyimide surface nor react with the cationic surfactant. Examples of anti-foaming agents are General Electric Company's AF9000 and Dow Corning's 544 products. A water rinse usually follows step (C).

The polyimide substrate at this stage has a clean, water-wettable surface which is highly amenable to an adhesion promotion treatment and subsequent metallization. As shown in the examples which follow, the above-described pretreatment significantly enhances adhesion of the metal layers to the substrate, especially when the substrate contains a filler.

In some embodiments of this invention, steps (B) and (C) can be combined, with the proviso that none of the components adversely react with each other. An adverse reaction would occur, for example, when a cationic surfactant which includes a pyridine ring is mixed with the basic solution. Thus, separate steps as described above are preferred when using pyridine-based cationic surfactants. In most other instances, these two steps can be combined by mixing the respective components according to the same proportions used when the steps are separate. However, the contact time need not be twice that of each individual step because other parameters can instead be adjusted, e.g., increased aeration and agitation of the tank holding the treatment solution while the workpieces are immersed therein, as well as increased solution temperatures.

It should be apparent from above that, in preferred embodiments, the pretreatment of this invention is aqueous-based, i.e., water is used for those steps which utilize a solvent. This does not exclude the presence of minor amounts of organic solvent in various steps, as long as such amounts do not cause fire or other health hazards.

Another aspect of this invention is a method for the application of a metal layer onto a polyimide surface, comprising a pretreatment of the surface by mild etching, contact of the surface with a basic solution, and contact of the surface with a long-chain cationic surfactant, followed by treatment of the surface with an adhesion promoter selected from the group consisting of compounds characterized by the presence of an >NO— moiety and compounds containing an organic double bond, followed by the electroless deposition of the metal.

Adhesion promoting compounds characterized by the presence of an >NO— moiety are described in the aforementioned application of Dumas et al., Ser. No. 947,116, filed Dec. 29, 1986, and incorporated herein by reference. Compounds of this type are usually characterized by a structure selected from the group consisting of

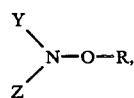

$Y^1$=N-O-R, and salts or hydrates thereof;

wherein R is selected from the group consisting of hydrogen; alkyl groups containing about 1 to about 10 carbon atoms; aromatic groups containing about 6 to about 20 carbon atoms; sulfonic groups; acyl groups; and amide groups;

wherein Y and Z are individually selected from the group consisting of hydrogen; alkyl groups containing about 1 to about 20 carbon atoms; aromatic groups containing about to about 20 carbon atoms; acyl groups; and amide groups;

or Y and Z together form at least one heterocyclic carbon-containing ring with said nitrogen;

or Z and R together form at least one heterocyclic carbon-containing ring with said moiety; and wherein $Y^1$ is selected from the group consisting of alkylidine groups having about 1 to about 20 carbon atoms and cycloalkylidine groups containing about 1 to about 20 carbon atoms. Preferred adhesion-promoting compounds conforming to the above formula are O,N-dimethylhydroxylamine hydrochloride, acetone oxime, 2-pyridine aldoxime, N-hydroxyphthalimide, and 1-hydroxybenzotriazole.$H_2O$. An especially preferred adhesion-promoting compound of this type is hydroxylamine, or a salt of hydroxylamine.

The Dumas et al. application further describes methods of preparing and using adhesion-promoting compound solutions. For example, the compound may be incorporated into a non-aggressive liquid as defined therein at a concentration in the range of from about 0.5M to about 4.0M. The polyimide surface may then be immersed in the adhesion promoter solution for about 10 minutes to about 60 minutes. The liquid component may be organic, e.g., pyridine, methylene chloride, N,N-dimethylformamide, methanol, or mixtures thereof; but is preferably water.

The other class of adhesion-promoting compounds described above are those which contain an organic double bond, as described in the aforementioned application of Foust et al., Ser. No. 103,618, filed Sept. 28, 1987, and incorporated herein by reference. These compounds usually have a formula selected from the group consisting of

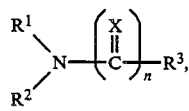

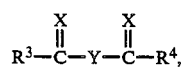

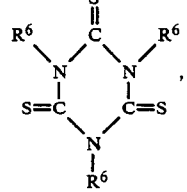

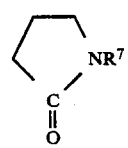

and salts or hydrates thereof;

wherein each X is independently oxygen or sulfur;

$R^1$ and $R^2$ are independently selected from the group consisting of hydrogen, alkyl groups containing about 1 to about 15 carbon atoms, aromatic groups containing about 6 to about 20 atoms, and alkoxy groups containing about 1 to about 10 carbon atoms;

$R^3$ and $R^4$ are independently selected from the group consisting of $R^1$, S—, $NH_2$, $NHR^1$, $NHNH_2$ and $R^1CO$—;

$R^5$ is selected from the group consisting of $R^1$, $NHR^1$, and S—;

$R^6$ and $R^7$ are each independently hydrogen or an alkyl group containing about 1 to 10 carbon atoms;

Y is selected from the group consisting of NH, NHNH, —S—S—, alkylene groups containing from 1 to about 10 carbon atoms, and arylene groups containing about 1 to about 20 carbon atoms; and n is 1 or 2.

In formulas I-V, $R^1$ and $R^2$ are preferably independently selected from the group consisting of hydrogen, lower alkyl groups, lower alkoxy groups, and benzene. Furthermore, $R^3$ and $R^4$ are preferably independently selected from the group consisting of lower alkyl groups, $NH_2$, $NHNH_2$, lower alkylamine groups, and $CH_3CO$—; while $R^5$ is preferably $NH_2CH_3$ or $NHCH_2CH_3$; and $R^6$ and $R^7$ are preferably each independently selected from hydrogen or a lower alkyl group.

The following is a preferred group of adhesion-promoting compounds of this type: thiosemicarbazide hydrochloride, 2,4-dithiobiuret, semicarbazide hydrochloride, acetylthiourea, thiourea, acetamide, urea, N,N-dimethylacetamide, thioacetamide, and thiocyanuric acid. The most preferred adhesion-promoting compound for this invention is thiourea.

This type of adhesion promoting compound is preferably incorporated into a non-aggressive liquid at a concentration in the range of about 0.1% by weight to about 50% by weight and more preferably, about 1% by weight to about 20% by weight. The non-aggressive liquid is preferably water.

A substantially neutral pH for the adhesion-promoting solution is usually preferred, but the solution is advantageously made acidic in certain instances by the addition of an acid, such as citric, phosphoric, sulfuric, hydrochloric, and the like. As described in the Foust et al. application mentioned above, the use of an acidic solution is preferred when copper is present on the substrate prior to treatment with the adhesion-promoting compound. The acid is present in an amount effective to maintain a pH less than about 4.4 and, preferably, less than about 1.0.

The temperature of the solution containing the adhesion-promoter is preferably maintained at between about 65° C. and 85° C. during treatment of the polyimide surface. Those skilled in the art can easily determine the optimal temperature, based in part on the water solubility characteristics of the particular adhesion-promoter.

After treatment of the polyimide surface by exposure to the adhesion-promoting compound, the substrate may be thoroughly rinsed with water and then activated for plating by methods well-known in the art and described, for example, in U.S. Pat. No. 3,589,916, as well as in the Foust et al. and Dumas et al. applications discussed above. For example, the substrate may be contacted with an acid solution of a precious metal, such as palladium chloride in hydrochloric acid, for a period of time sufficient to cause catalytic activation of the substrate surface.

It is often useful to begin the activation of the substrate by treatment with an additive which aids in absorption of the plating catalyst. Such additives are well-known in the art. Exemplary aids to catalyst absorption include Shipley 1175A, a product of the Shipley Company, and Metex 9420, a product of the MacDermid Corporation. Immersion in about 0.1% to about 5% by volume of either of these agents in water for about 1 minute to about 10 minutes at a temperature of from about 40° C. to about 80° C. is usually sufficient. Although such a treatment is not deemed critical to the present invention, its use often enhances the uniform deposition of electrolessly-applied metals onto the substrate.

One illustrative activation technique involves immersing the substrate in a solution of Shipley Cataprep® 404, a product of the Shipley Company. This solution provides a protecting agent for the plating catalyst subsequently applied, and comprises sodium bisulfate and various surfactants. The substrate may then be immersed in a solution of Shipley Cataposit® 44, which contains the Cataprep® 404 ingredients, tin, and palladium, which is the electroless plating catalyst. After a water rinse, the substrates may then be immersed in a solution of Shipley Cuposit® Accelerator 19, a fluoroboric acid-containing formulation used to separate tin from the plating catalyst.

Activation and plating processes suitable for the present invention are also described in the application of W. T. Grubb et al., Ser. No. 944,728, filed Dec. 22, 1986, and incorporated herein by reference, and in U.S. Pat. Nos. 3,011,920 and 3,841,881, issued to Shipley and Feldstein et al., respectively, both of which are also incorporated herein by reference. A water rinse generally follows the activation step.

After surface activation and rinsing, electroless plating can be undertaken. Illustrative metals used to form the metallization layer include copper, palladium, nickel, and gold. Copper is usually the metal of choice when forming a printed circuit. Electroless baths are well-known in the art and are generally described in the *Kirk-Othmer Encyclopedia of Chemical Technology*, 3rd Edition, Volume 8, the contents of which are incorporated herein by reference. The selection of a particular bath or electroless plating process is not critical to the present invention. The contents of the bath and the particular plating parameters, e.g., temperature, pH, and immersion time, will of course depend on the particular plastic serving as the substrate, and also upon the particular metal being deposited thereon. Suitable plating baths include the Shipley Cuposit® 250 system and the Enthone® 406 system. Furthermore, the Grubb et al. and Dumas et al. applications mentioned above list suitable electroless plating formulations. Immersion times, bath temperatures, and other operating parameters can be determined and controlled according to manufacturers' suggestions. Those having ordinary skill in the plating arts will be able to determine the most appropriate plating regimen for a particular situation.

The polyimide surface is subjected to a heat treatment after electroless deposition of the metal. Oven heating of the entire article, i.e., substrate with metal thereon, is sufficient, although any heating method is suitable. Typically, this heat treatment is carried out at a temperature ranging from about 60° C. to about 170° C. for about 5 minutes to about 120 minutes, with higher temperatures within the above range generally compensating for shorter duration, and vice versa. Although the mechanism is not understood, the heat treatment appears to reduce the time required to attain optimal adhesion.

If another layer of metal is to be applied on the surface, e.g., by electroplating, the above-described heat treatment can in some instances be omitted if a heat treatment is employed after the plating of more of the metal, as described below. However, preferred embodiments include the heat treatment prior to deposition of more of the metal. Most preferred embodiments include a heat treatment prior to the deposition of more of the metal (i.e., after the electroless deposition), along with another heat treatment after the final layer of metal has been applied, as described below.

Electroplating is the preferred application method for the second metal layer. The substrate is usually cleaned prior to immersion in the electroplating bath. The cleaning can be performed by rinsing the substrate with a dilute solution of a strong acid, such as 10% by weight sulfuric acid in water.

Electroplating baths are well-known in the art and are described, for example, in U.S. Pat. No. 4,555,315, incorporated herein by reference, although the particular electroplating bath used is not critical to the present invention. The choice of course depends in part on the particular metal being deposited. Suitable metals include those described for the electroless deposition. Furthermore, those skilled in the art appreciate that the particular bath contents will depend upon some of the factors considered for the electroless deposition of metal described above. Typically, the electroplating bath for copper is operated at a temperature ranging from about 16° C. to about 38° C., with a cathode current density in the range of about 1 ASF to about 80 ASF. A description of baths for plating copper or various other metals is given in the Kirk-Othmer reference described above, in Vol. 8, beginning on page 826. Baths used to apply a layer of copper to the electrolessly-applied layer typically include an aqueous acidic copper electrolyte such as those of the acidic copper sulfate or acidic copper fluoroborate type; halide ions, such as chloride and/or bromide ions; and various other components well-known in the art. The thickness of this second metal layer will of course depend upon the desired end use of the metal-coated substrate.

As also described in the application of Foust et al. and Grubb et al., the metal applied on the polyimide substrate may be in the form of a pattern. Exemplary patterning methods are also described in U.S. Pat. No. 3,562,005, issued to DeAngelo et al. and incorporated herein by reference.

In preferred embodiments of the present invention, the electrolytic layer applied on top of the electrolessly-applied layer is substantially free of chemical additives normally present in an electrolytic layer, such as leveling agents and brighteners. The electrolytic plating bath used for this deposition is thus sometimes referred to herein as a "nonadditive" bath. Applicants have discovered that the omission of these additives results in an exceptionally high level of adhesion between the polyimide surface and the electrolessly-applied metal layer, as shown in the examples which follow. An example of an electrolytic bath without leveling agents or brighteners is one containing about 100 grams/liter (g/L) to about 160 g/L of copper sulfate; about 50 g/L to about 70 g/L of a strong acid such as sulfuric acid, and about 35 parts per million (ppm) to about 75 ppm chloride ion, the last-mentioned component usually being supplied in the form of hydrochloric acid. Other well-known electroplating baths could be used in this embodiment, with the proviso that brighteners, leveling agents, and other chemical additives be omitted from the baths. A water rinse usually follows plating.

A heat treatment as described above may be utilized at this stage. A typical heating regimen would be about 1 hour to about 24 hours at about 75° C. to about 150° C.

The metallization layer applied from a solution without the chemical additives described above usually has a nodular, somewhat rough appearance. While such a surface may be suitable for some end uses, a smooth, level surface is desired for others. A smooth surface can be achieved by the deposition of a second electrolytic layer, which contains chemical additives, on top of the first electrolytic layer. The bath used to apply this layer is sometimes referred to herein as an "additive" bath.

An etching agent is often used prior to the deposition of this second electrolytic layer. Examples of etching agents include ammonium or sodium persulfate, and a mixture of hydrogen peroxide and sulfuric acid. A water rinse usually follows the etching step. The surface is then rinsed again with a dilute solution of a strong acid in order to remove residual oxides of the plated metal. An example of this last-mentioned step would be an immersion of the substrate in a 1% by weight to about 10% by weight aqueous sulfuric acid solution for about 10 seconds to about 120 seconds. The substrate is now ready for further plating.

The electrolytic bath for the second electrolytic layer can be one of the conventional baths known in the art. These baths contain effective amounts of brighteners and leveling agents, as well as other additives, all of which are known in the art and are described, for example, in *Decorating Plastics*, edited by James M. Margolis, Hanser Publishers, 1986; by J. D. Reid and A. P. David in *Plating and Surface Finishing*, January, 1987, pp. 66–70; in *Modern Electroplating*, edited by Frederick A. Lowenheim, Third Edition, John Wiley and Sons, Inc.; and in the United Kingdom Patent application of D. Morrissey et al., GB2123036A. Examples of other chemical additives are stress relievers, depolarizers, plating suppressors, and wetting agents, as well as agents used for hardening, grain refining, reducing trees, and limiting current density. Thus, the term "chemical additives" as used herein is meant to include any of the above-mentioned agents.

After deposition of the second electrolytic layer, the substrate is rinsed again with water and then heat-treated to further enhance adhesion of the metal layers to the substrate. A typical heat treatment for this step involves temperatures ranging from about 75° C. to about 150° C. for a time period ranging from about 1 hour to about 24 hours. This heat treatment obviates the heat treatment used after the first electrolytic deposition.

The result of the second electrolytic deposition is a smooth, bright metal layer characterized by a high level of adhesion to the polyimide substrate.

In preferred embodiments, an article prepared by the method of this invention usually has an electroless metallization layer which is about 0.25 micron to about 2 microns thick; a first electrolytically-applied layer of at least about 5 microns; and a second electrolytically-applied layer having a thickness of at least about 5 microns.

Articles of various embodiments of this invention are suitable as printed circuit boards which would contain metallic layers as described herein in a printed circuit pattern or "trace".

The present invention will be further understood from the description of specific examples which follow. These examples are intended for illustrative purposes only and should not be construed as a limitation upon the broadest aspects of the invention. All liquid ratios are by volume, unless otherwise indicated.

In these examples, adhesion of the metal to the substrate was evaluated by measuring the force necessary to peel strips of the metal from the substrate surface. In the test, the metal surface of each plated sample is etched into ⅛ inch strips. An end of each strip is clipped to an Ametek digital force measuring gauge which is connected to a computer processor. Force values required to lift the metal strips from the substrate are converted by the computer into pounds per inch peel values. Multiple peel values for each strip are obtained and then averaged.

EXAMPLE 1

Samples corresponding to each entry in Table 1 were substrates formed from a polyetherimide material having 30% by weight milled glass fibers dispersed therein. Unless otherwise indicated, each sample was treated according to the following regimen:

| Step | Procedure[a] | Time (minutes) |
|---|---|---|
| A | 1,1,2-trichloro-1,2,2-trifluoroethane | 2 |
| B | Dry the substrate | — |
| C | Concentrated sulfuric acid | 0.5 |
| D | Rinse in water | 2 |
| E | Potassium hydroxide in water (5M) | 5 |
| F | Rinse in water | 2 |
| G | Treatment with cationic surfactant[b], 50° C. | 5 |
| H | Rinse in water | 2 |
| I | Treatment with adhesion-promoter[c], 75° C. | 10 |
| J | Rinse in water | 2 |
| K | Shipley Cleaner/Conditioner 1175A (2.5% by volume in water), 65° C. | 5 |
| L | Rinse in water | 2 |
| M | Shipley Cataprep ® 404 | 1 |
| N | Shipley Cataposit ® 44 (1.5% in water by volume, 44° C.) | 3 |
| O | Rinse in water | 2 |

-continued

| Step | Procedure[a] | Time (minutes) |
|---|---|---|
| P | Shipley Accelerator ® 19 | 3 |
| Q | Rinse in water | 2 |
| R | Shipley Cuposit ® 250, 48° C. | 30 |
| S | Rinse in water | 2 |
| T | Heat treatment at 75° C. | 120 |
| U | Plating in copper electroplating bath[d] | 60 |
| V | Heat treatment at 95° C. | 16 hours |

[a]Substrates were immersed in the liquid components.
[b]1% by weight cetylpyridinium chloride, 0.05% by weight AF9000 antifoaming agent, in water.
[c]12.5% by weight thiourea in water, along with 1% by weight citric acid.
[d]125 g/L $CuSO_4 \cdot 5H_2O$; 60 g/L $H_2SO_4$; 50 ppm chloride; plating at 36 ASF to 2 mils total thickness.

After being cooled to room temperature, the samples were tested for adhesion by the method described above. The results are shown in Table 1.

TABLE 1

Adhesion Value Results: Aqueous-Based Pretreatment of this Invention as Compared to Organic Solvent-Based Pretreatment[a]

| | Adhesion (lb/in) | |
|---|---|---|
| Substrate Filler | Aqueous System | Organic Solvent-Based System |
| None | 7 | 7 |
| 30% glass | 10 | 10 |
| 30% glass, 1.5% black carbon | 10 | 11 |

[a]The organic solvent-based system is described in Example 1 of the copending Foust et al. application mentioned above.

The above results demonstrate that use of the aqueous-based pretreatment results in substantially the same adhesion of metal to the substrate as when the organic solvent-based system was used.

Table 2 below represents the chemical element analysis on a polyetherimide (30% glass-filled) substrate after each major stage in the pretreatment of the sample. Analysis was undertaken using a Surface Science X-ray Photoelectron Spectroscopic Analyzer, Model SSX-100, available from the instrument division of Kevex Corporation.

TABLE 2

Analysis of Substrate Surface

| | | Surface Composition, Atomic % | | | |
|---|---|---|---|---|---|
| Sample | Explanation | C | N | O | S |
| Control | Untreated Plastic[a] | 82.4 | 4.4 | 13.3 | — |
| 2 | After $H_2SO_4$ (Step C) | 79.5 | 4.0 | 14.3 | 1.4 |
| 3 | After $KOH/H_2O$ (Step E) | 78.6 | 3.8 | 15.0 | 0.8 |
| 4 | After cationic surfactant (Step G) | 85.4 | 4.1 | 9.6 | — |

[a]Theoretical composition of polyetherimide prior to any type of treatment.

As shown by Sample 2, sulfur has been incorporated into the surface of the substrate which has been oxidized with the sulfuric acid. This step resulted in a residual white film on the surface.

The elemental analysis for Sample 3 was similar to that of Sample 2, with a small increase in oxygen and a small decrease in sulfur content. Examination of the surface at this stage showed numerous grooves between sections of the residual film.

Sample 4 demonstrates the action of the cationic surfactant. The presence of sulfur has been eliminated from the surface, and the oxygen content has been also decreased. A photomicrograph of the sample indicated a clean surface similar in appearance to the untreated control surface.

EXAMPLE 2

This example describes the combination of the basic solution treatment (Step E of Example 1) with the cationic surfactant treatment (Step G of Example 1), using the same type of substrate.

The following steps are the only ones changed from those of Example 1:

| Step | Procedure | Time (minutes) |
|---|---|---|
| E | KOH (5M), dodecyltrimethylammonium bromide (1%), room temperature | 5 |

Steps F and G were thus eliminated.
The average adhesion value was 9.6 lb/in.

EXAMPLE 3

This example describes the inclusion of organic solvent in step G of Example 1, using the same type of substrate. All other steps were the same.

| Step | Procedure | Time (minutes) |
|---|---|---|
| G | Cetylpyridinium chloride (0.5%) in N—methylpyrrolidone/water (50/50 by volume), room temperature | 5 |

The average adhesion value was 11.3 lb/in.

EXAMPLE 4

A polyetherimide (containing 30% glass) was subjected to the steps in Example 1, with the cationic surfactant step (Step G) being changed to the following:

| Step | Procedure | Time (minutes) |
|---|---|---|
| G | Dodecyltriphenylphosphonium bromide (1%) in water, 50° C. | 5 |

The average adhesion value was 14.5 lb/in.

EXAMPLE 5

Polyetherimide substrates containing 30% glass were pretreated, adhesion promotion-treated, and electroless plated as in Example 1 of the Foust et al. application mentioned above. Selected substrates were then plated in one of the baths listed in Table 3 below. The nonadditive bath contained 125 g/L $CuSO_4 \cdot 5H_2O$; 60 g/L $H_2SO_4$; and 50 ppm chloride ion. The other baths additionally contained the indicated additive. The electroplated layer thickness in each case was 2 mils.

TABLE 3

| Electrolytic Copper Bath Additives | Additives Present | | Average Adhesion Value (lb/in) |
|---|---|---|---|
| | Leveller | Brightener | |
| Nonadditive | No | No | 10.0 |
| Additive A | Yes | Yes | 6.3 |
| Additive B | Yes | Yes | 5.4 |
| Additive C | Yes | Yes | 5.2 |
| Additive D | Yes | No | 6.6 |

Additive A: Lea Ronal Copper Gleam PCM Plus, which contains mixtures of disulfide brighteners and polyorganic oxide levelling agents.
Additive B: Lea Ronal PC Gleam, which contains mixtures of disulfide brighteners and polyorganic oxide levelling agents.
Additive C: Electrochemicals PC-667, containing an organic dye system.
Additive D: BASF Pluronic ® L31, containing polyorganic oxides as levelling agents.

The above results indicate that removal of the additives resulted in an increase in adhesion. The copper surface for the nonadditive layer was quite rough.

EXAMPLE 6

Polyetherimide substrates containing 30% glass were pretreated, adhesion promotion-treated, and electroless plated as in Example 1 of the Foust et al. application mentioned above. The following steps represent a typical metallization, which includes the electrolytic deposition of a layer of copper without chemical additives, followed by the electrolytic deposition of a copper layer containing chemical additives.

| Step | Procedure[a] | Time (minutes) |
|---|---|---|
| A | Heat treatment at 75° C. | 120 |
| B | 10% $H_2SO_4$ | 0.5 |
| C | Electrolytic copper without chemical[b] additives | 15 |
| D | Rinse in water | 2 |
| E | Copper microetch[c] | 2 |
| F | Rinse in water | 2 |
| G | 10% $H_2SO_4$ | 0.5 |
| H | Electrolytic copper bath containing[d] chemical additives | 40 |
| I | Rinse in water | 2 |
| J | Heat treatment at 95° C. | 40 hours |

[a]Substrates were immersed in the liquid components.
[b]125 g/L $CuSO_4.5H_2O$; 60 g/L $H_2SO_4$; 50 ppm chloride; plating at 36 ASF to 0.5 mil total thickness.
[c]Electrochemicals CoBra Etch, available from Electrochemicals, Inc., of Youngstown, Ohio.
[d]Lea Ronal Copper Gleam PCM Plus electrolytic copper bath.

EXAMPLE 7

Various samples were treated as in Example 6 above, except that the additive and nonadditive copper layers were applied as shown in Table 4. The total copper thickness was maintained at about the same value.

TABLE 4

| Variation of Additive and Nonadditive Layer Thickness | | | |
|---|---|---|---|
| Nonadditive Copper Thickness (mil) | Additive Copper Thickness (mil) | Average adhesion value (lb/in) | Average Surface Roughness[a] (μ) |
| 2.0 | 0 | 10.7 | 3.0 |
| 0.5 | 1.5 | 10.4 | 1.0 |
| 0.33 | 1.5 | 9.0 | 1.0 |
| 0.17 | 1.5 | 8.0 | 0.5 |
| 0 | 2.0 | 4.6 | 0.5 |

[a]As measured by Sloan Dektak IIA.

The above results indicate that a copper layer containing organic additives can be plated on top of the nonadditive layer to provide a smooth, shiny surface, while still providing acceptable adhesion to the underlying substrate.

Although the invention has been described in its preferred forms with a certain degree of particularity, it is understood that the present disclosure is by way of example, and that numerous changes may be made without departing from the spirit and scope of this invention.

What is claimed is:

1. A method for pretreating a polyimide surface in preparation for an adhesion promotion treatment and subsequent metallization on the surface, comprising mild etching of the surface, contact of the surface with a basic solution, and contact of the surface with a cationic surfactant which is capable of removing a residual film formed on the surface after the mild etching step.

2. The method of claim 1 wherein the mild etching step is performed by contact with a compound selected from the group consisting of sulfuric acid, N,N-dimethylformamide, N-methyl-2-pyrrolidone, pyridine, tetrahydrofuran, and methylene chloride.

3. The method of claim 2 wherein the etching compound is sulfuric acid dissolved in water at a concentration of at least about 85% by weight.

4. The method of claim 2 wherein the surface is cleaned by contact with a halocarbon material prior to the mild etching step.

5. The method of claim 1 wherein the basic solution comprises water and a compound selected from the group consisting of sodium hydroxide, potassium hydroxide, tetramethylammonium hydroxide, and mixtures thereof.

6. The method of claim 5 wherein the concentration of the basic compound in water is about 0.1 molar to about 10 molar.

7. The method of claim 6 wherein the cationic surfactant is used in the form of an aqueous solution at a concentration of from about $3 \times 10^{-4}$M to about 0.3M.

8. The method of claim 7 wherein the concentration of cationic surfactant ranges from about 0.001M to about 0.1M.

9. The method of claim 7 wherein the aqueous solution also contains a defoamer.

10. The method of claim 7 wherein the aqueous solution is used at a temperature in the range of about 20° C.–60° C.

11. The method of claim 1 wherein the cationic surfactant is water-soluble.

12. The method of claim 11 wherein the cationic surfactant is stearyldimethylbenzylammonium bromide.

13. The method of claim 11 wherein the cationic surfactant is selected from the group consisting of alkylpyridinium halides, alkyltrimethylammonium halides, alkyltriphenylphosphonium halides, and tetraalkylammonium halides.

14. The method of claim 13 wherein the cationic surfactant is selected from the group consisting of cetylpyridinium bromide monohydrate, cetylpyridinium chloride monohydrate, dodecyltrimethylammonium bromide, and hexadecyltrimethylammonium bromide.

15. The method of claim 13 wherein the cationic surfactant is selected from the group consisting of dodecylpyridinium chloride, octyltrimethylammonium bromide, decyltrimethylammonium bromide, dodecyltrimethylammonium bromide, hexadecyltrimethylammonium bromide, decyltriphenylphosphonium bromide, dodecyltriphenylphosphonium bromide, and tetrabutylammonium chloride.

16. The method of claim 1 wherein contact of the surface with the basic solution and with the cationic surfactant are performed as one step.

17. A method for the application of a metal layer onto a polyimide surface, comprising a pretreatment of the surface by mild etching, contact of the surface with a basic solution, and contact of the surface with a cationic surfactant which is capable of removing a residual film formed on the surface after the mild etching step, followed by treatment of the surface with an adhesion promoter selected from the group consisting of compounds characterized by the presence of an >NO— moiety and compounds containing an organic double bond, followed by the electroless deposition of the metal.

18. The method of claim 17 wherein the adhesion promoting compound is selected from the group consisting of hydroxylamine, salts of hydroxylamine, O,N-dimethylhydroxylamine hydrochloride, acetone oxime, 2-pyridine aldoxime, N-hydroxyphthalimide, 1-hydroxybenzotriazole·H$_2$O, thiosemicarbazide hydrochloride, 2,4-dithiobiuret, semicarbazide hydrochloride, acetylthiourea, thiourea, acetamide, urea, N,N-dimethylacetamide, thioacetamide, and thiocyanuric acid.

19. The method of claim 18 wherein the mild etching step is performed by contact with a compound selected from the group consisting of sulfuric acid, N,N-dimethylformamide, N-methyl-2-pyrrolidone, pyridine, tetrahydrofuran, and methylene chloride.

20. The method of claim 19 wherein the basic solution comprises water and a compound selected from the group consisting of sodium hydroxide, potassium hydroxide, tetramethylammonium hydroxide, and mixtures thereof.

21. The method of claim 20 wherein the long-chain cationic surfactant is selected from the group consisting of cetylpyridinium chloride monohydrate, dodecyltrimethylammonium bromide, and hexadecyltrimethylammonium bromide, and is used in the form of an aqueous solution at a concentration of from about $3 \times 10^{-4}$M to about 0.3M.

22. The method of claim 17 wherein a layer of metal which is free of chemical additives is electrolytically deposited on top of the electrolessly-applied layer.

23. The method of claim 22 wherein a metal layer which contains effective amounts of chemical additives is electrolytically deposited on top of the first electrolytically-deposited layer.

24. The method of claim 23 wherein the chemical additives comprise leveling agents and brighteners.

25. The method of claim 23 wherein each metallization layer is formed of copper.

26. The method of claim 25 wherein the metal on the polyimide surface is patterned to form a printed circuit pathway.

27. An article comprising
(A) a polyimide substrate which has been pretreated by mild etching of the surface, contact of the surface with a basic solution, and contact of the surface with a cationic surfactant which is capable of removing a residual film formed on the surface after the mild etching step, followed by treatment with an adhesion-promoting compound;
(B) an electrolessly-applied metal layer disposed on the substrate; and
(C) an electrolytically-applied metal layer free of chemical additives disposed on top of the electrolessly-applied layer.

28. The article of claim 27 further including a second electrolytically-applied layer disposed on the first electrolytically-applied layer and containing chemical additives.

29. The article of claim 28 wherein each metal layer is formed of copper.

30. The article of claim 28 wherein the electrolessly-applied layer has a thickness of from about 0.2 micron to about 2 microns; the first electrolytically-applied layer has a thickness of at least about 5 microns; and the second electrolytically-applied layer has a thickness of at least about 5 microns.

31. A printed circuit board comprising:
(A) a polyimide substrate;
(B) an electrolessly-applied metal layer disposed on the substrate; and
(C) an electrolytically-applied metal layer free of chemical additives disposed on top of the electrolessly-applied layer;
wherein the metal layers are a pattern of traces which provide electrical connections between components on the printed circuit board.

32. The printed circuit board of claim 31 wherein a second electrolytically-applied metal layer containing chemical additives is disposed on the first electrolytically-applied layer, and is also a patterned trace.

* * * * *